United States Patent [19]
Kashima

[11] Patent Number: 6,069,528
[45] Date of Patent: May 30, 2000

[54] AUTOMATIC MICROWAVE GAIN CONTROL DEVICE

[75] Inventor: Yukiro Kashima, Osaka, Japan

[73] Assignee: Matsushita Electric Industrial Co., Ltd., Osaka, Japan

[21] Appl. No.: 09/127,302

[22] Filed: Jul. 31, 1998

[30] Foreign Application Priority Data

Jul. 31, 1997 [JP] Japan ................................ 9-205660

[51] Int. Cl.⁷ ................................ H03F 3/60; H03G 3/20
[52] U.S. Cl. ........................ 330/53; 330/140; 330/284
[58] Field of Search ................................ 330/53, 54, 129, 330/140, 284, 286

[56] References Cited

U.S. PATENT DOCUMENTS

| | | | |
|---|---|---|---|
| 4,760,347 | 7/1988 | Li et al. | 330/140 X |
| 5,694,082 | 12/1997 | Schmidt | 330/284 X |
| 5,862,460 | 1/1999 | Rich | 330/284 X |

FOREIGN PATENT DOCUMENTS

| | | |
|---|---|---|
| 4-40702 | 2/1992 | Japan . |
| 4-219001 | 8/1992 | Japan . |
| 6-350361 | 12/1994 | Japan . |
| 8-125448 | 5/1996 | Japan . |

*Primary Examiner*—Steven J. Mottola
*Attorney, Agent, or Firm*—Ratner & Prestia

[57] ABSTRACT

An automatic microwave gain control device comprises a signal amplifier, a directional coupler coupled to one terminal of the signal amplifier for receiving a portion of an amplified microwave signal power, a microwave detection diode connected to one end of the directional coupler, a bias supply circuitry supplying an adjustable D.C. bias voltage to the microwave detection diode, a D.C. amplifier for amplifying a voltage derived from an addition of a microwave detection output voltage of the microwave detection diode and the bias voltage of the bias supply circuitry, and a variable attenuator provided at another side of the terminals of the signal amplifier, wherein the variable attenuator controls an output power outputted from an output terminal to be constant power by way of controlling a magnitude of attenuation of the signal at the another terminal of the signal amplifier according to an output voltage of the D.C. amplifier. This is done so as not to be affected by dispersion of characteristic and dispersion of mounting position of the microwave detection diode.

5 Claims, 6 Drawing Sheets

AUTOMATIC MICROWAVE GAIN CONTROL DEVICE

FIELD OF THE INVENTION

The present invention relates to an automatic microwave gain control device for use in microwave transmission amplifiers, receiving down-converters, etc. for satellite broadcasting and communication via broadcasting satellites and communication satellites.

BACKGROUND OF THE INVENTION

In recent years, there have been an increasing number of occasions for ordinary households to receive directly a plurality of satellite broadcastings. This has occurred as satellite broadcastings have come to a stage of being wide spread, and communication satellite broadcastings have since started using commercial communication satellites. With this trend, there has been an increasing demand for stabilization of performance of microwave signaling equipment for reception and transmission.

An automatic microwave gain control device of the prior art is now described by referring to FIG. 6.

A microwave signal inputted through a microwave signal input terminal 68 is amplified by a microwave signal amplifier 61, and it is transferred to a microwave signal output terminal 60. A directional coupler 65 is connected at the microwave signal output terminal 60, and one end of the directional coupler 65 is connected to a microwave detection diode 66. A part of the microwave signal output is supplied to the diode 66 through the directional coupler 65. The diode 66 produces a D.C. voltage corresponding to the microwave signal output that, in turn, is supplied to a D.C. amplifier 67.

The D.C. voltage amplified by the D.C. amplifier 67 is supplied to a PIN diode 64, which functions as a variable attenuator. The PIN diode 64 connected to a tip of a half-wave stub 63 absorbs power of the microwave signal inputted from the microwave signal input terminal 68 according to a magnitude of the D.C. voltage. As a result, the automatic microwave gain control device of the prior art maintains a constant output power at the microwave signal output terminal 60 by this function of the PIN diode 64.

With this circuitry of the prior art, however, it is difficult to stabilize a detection characteristic at the super high frequency ("SHF") band, since the detection performance of the microwave detection diode 66 is affected by characteristic dispersion of the diode individually as well as dispersion of mounting position with the structure as described above. It has been a problem to reduce the characteristic dispersion of microwave detection diodes because the detection characteristic of especially the microwave detection diodes disperses more than the other circuit elements.

SUMMARY OF THE INVENTION

An automatic microwave gain control device comprises a signal amplifier, a directional coupler coupled to one terminal of the signal amplifier for receiving a portion of the signal amplifier output, a microwave detection diode connected to one end of the directional coupler, a bias supply circuitry supplying an adjustable D.C. bias voltage to the microwave detection diode, a D.C. amplifier for amplifying a voltage derived from an addition of a microwave detection output voltage of the microwave detection diode and the bias voltage of the bias supply circuitry, and a variable attenuator provided at another side of the terminals of the signal amplifier. The variable attenuator controls output power outputted from an output terminal of the automatic microwave gain control device so that it is constant. This is accomplished by controlling magnitude of attenuation of the signal at another terminal of the signal amplifier according to an output voltage of the D.C. amplifier so as not to be affected by dispersion of characteristic and dispersion of mounting position of the microwave detection diode.

DESCRIPTION OF THE PREFERRED EMBODIMENTS

First Exemplary Embodiment

Figure 1:
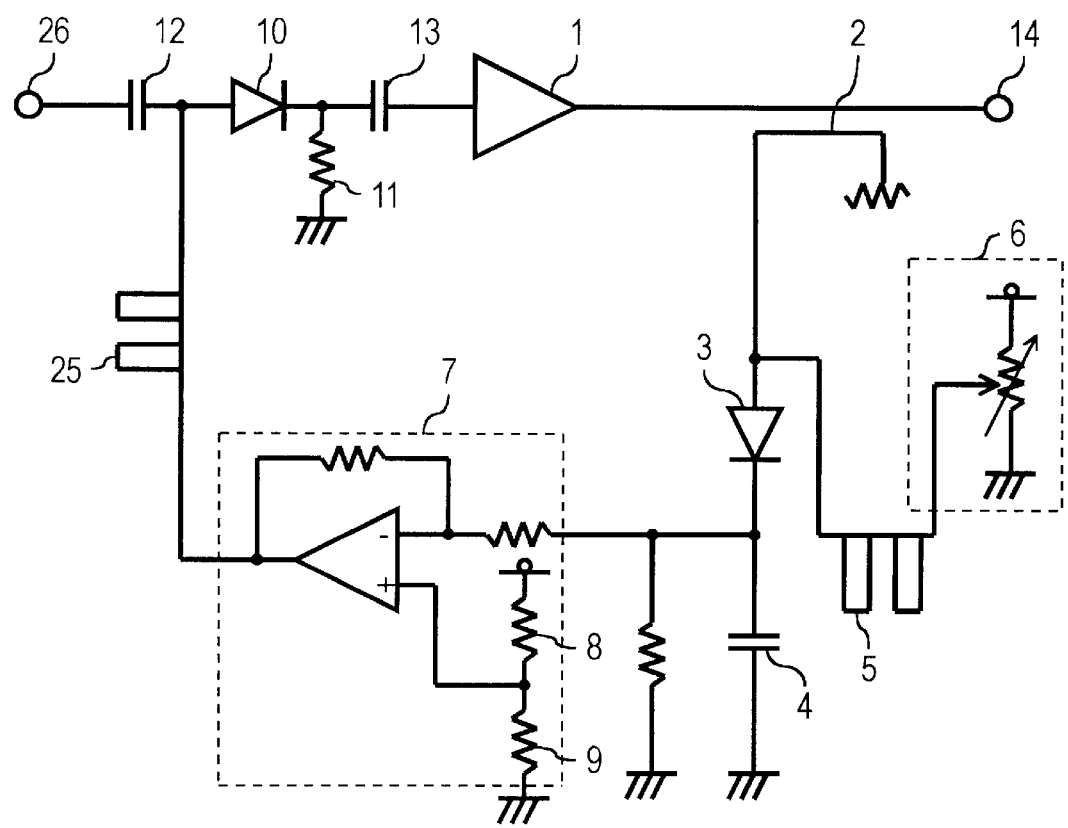
FIG. 1 is a circuit block diagram of an automatic microwave gain control device in accordance with a first exemplary embodiment of the present invention.

A structure and operation of an automatic microwave gain control device of a first embodiment of the present invention is described below by referring to a circuit block diagram of FIG. 1 depicting a circuit pattern.

A directional coupler 2, which is connected to an output terminal of a microwave signal amplifier 1, is also connected at its one end to an anode of a microwave detection diode 3 and, through a low-pass filter 5, to a D.C. bias supply circuitry 6 comprising a D.C. power supply and a variable resistor. Another end of the directional coupler 2 is connected to a matching resistor. A cathode of the microwave detection diode 3 is connected to a smoothing capacitor 4, of which other the end is earth-grounded, and a D.C. amplifier 7 comprising an operational amplifier, resistors 8 and 9 and others. An output terminal of the D.C. amplifier 7 is connected to an anode of a PIN diode 10 and a D.C. blocker 12 for blocking a D.C. current via a low-pass filter 25. A cathode of the PIN diode 10 is connected to a load resistor 11, the other end of which is earth-grounded, and the microwave signal amplifier 1 via a D.C. blocker 13. An input terminal 26 is connected to the D.C. blocker 12 and an output terminal 14 is connected to another end of the directional coupler 2. A microwave inputted through the input terminal 26 is stabilized by the automatic microwave gain control device of this embodiment and delivered from the output terminal 14 thereof. The microwave signal amplifier 1, the directional coupler 2 and other components, except for the bias supply circuitry 6, are commonly constructed on a single piece of dielectric substrate.

The automatic microwave gain control device, constructed as above, operates as described below:

A part of the microwave signal power amplified by the microwave signal amplifier 1 is taken out by the directional coupler 2, and supplied to the microwave detection diode 3 connected to one end thereof.

The anode of the microwave detection diode 3 is impressed with a positive bias voltage by the D.C. bias supply circuitry 6 via the low-pass filter 5. This positive bias voltage is adjustable.

An operating point of the detection diode 3 is controllable by adjusting the bias voltage to the microwave detection diode 3. Adjusting the bias voltage controls junction impedance of the detection diode 3 so as to reduce substantially dispersion of the impedance attributable to dispersion of the characteristic and mounting position of the detection diode, thereby reducing an adverse effect to the detection characteristic caused by the dispersion, so that an extremely stable detection characteristic is attained.

The microwave signal detected by the microwave detection diode 3 is smoothed and converted into D.C. voltage by the smoothing capacitor 4. The smoothed D.C. voltage is then supplied to the D.C. amplifier 7 after being added to the D.C. bias voltage from the bias supply circuitry 6. The D.C. amplifier 7 regulates its output voltage so as to equalize a preset voltage divided by the resistors 8 and 9 and the supplied voltage, which is a sum of the smoothed D.C. voltage and the D.C. bias voltage, by comparing the two potentials. The output voltage of the D.C. amplifier 7 is supplied to the anode of the PIN diode 10 through the low-pass filter 25. It is preferable for the D.C. amplifier 7 to have an amplification factor of more than 1.

The PIN diode 10 constitutes a variable attenuator together with the load resistor 11. Magnitude of attenuation in the variable attenuator decreases as the forward bias current to the PIN diode 10 increases, and the magnitude of attenuation increases as the forward bias current decreases. The magnitude of attenuation increases furthermore if the PIN diode 10 is impressed with a reversed bias.

Therefore, if the microwave power input increases, microwave power taken out by the directional coupler 2 increases; voltage applied to the D.C. amplifier 7 increases; forward current to the PIN diode 10 decreases; and magnitude of attenuation in the variable attenuator increases; so that the microwave power decreases. Conversely, if the microwave power taken out by the directional coupler 2 decreases, the magnitude of attenuation in the variable attenuator decreases so as to cause the microwave power to increase. Accordingly, the automatic microwave gain control device of the present embodiment realizes stable output power in spite of variations in the microwave input.

Further, when the voltage of the bias supply circuitry 6 to be supplied to an anode of the detection diode 3 is adjusted to increase, the voltage applied to the D.C. amplifier 7 increases; the forward current to the PIN diode 10 decreases; and the magnitude of attenuation in the variable attenuator increases; resulting in a decrease of the microwave power. Conversely, when the voltage of the bias supply circuitry 6 is adjusted to decrease, the voltage applied to the D.C. amplifier 7 decreases; the forward current to the PIN diode 10 increases; and the magnitude of attenuation in the variable attenuator decreases; resulting in an increase of the microwave power. Thus, the automatic microwave gain control device of the present embodiment is able to control magnitude of the microwave output power by adjusting the voltage of the bias supply circuitry 6.

In this way, the automatic microwave gain control device of the present embodiment controls an amplification gain of the microwave signal by operating the variable attenuator with a D.C. voltage, which is amplified by the D.C. amplifier 7 after addition of a D.C. voltage produced by detecting and smoothing of the microwave signal and the bias voltage without being affected by dispersion of the characteristic and mounting position of the microwave detection diode 3. Thus, by using this feedback loop, the automatic microwave gain control device operates for maintaining the microwave output power produced at the microwave output terminal 14 being constant at all times.

Also, the automatic microwave gain control device of the present embodiment is able to produce a desirable magnitude of the microwave output power by adjusting the DC voltage supplied from the bias supply circuitry 6.

Second Exemplary Embodiment

A structure and operation of an automatic microwave gain control device of a second embodiment of the present invention is described below by referring to FIG. 2. Circuit elements in FIG. 2 designated by the same reference numerals as FIG. 1 are not described here since they operate similarly.

The automatic microwave gain control device of the second embodiment differs from that of the first embodiment in certain respects, namely, that an amplification factor for the microwave signal is increased as compared to the first embodiment by connecting two microwave signal amplifiers 15 and 16 after the amplifier 1, and that the microwave signal is outputted after converting it into a form of electromagnetic wave by providing with a microwave strip transmission line ("strip line") 27, a probe 17 and a waveguide 18 at an output side of the directional coupler 2 so as to compose a strip line-waveguide converter for converting the microwave signal from a transverse electromagnetic wave mode ("TEM wave") into a waveguide mode.

An operation of the automatic microwave gain control device constructed as above is described below:

In the same manner as the first embodiment, the automatic microwave gain control device of the present embodiment is able to detect the microwave signal without being affected by dispersion of the characteristic and mounting position of the microwave detection diode 3 by varying the D.C. voltage of the bias supply circuitry 6, and to maintain at constant magnitude the microwave output power that is outputted from the waveguide 18 through the strip line 27 and the probe 17. Also, the device is able to produce a desirable magnitude of the microwave output power by adjusting the D.C. voltage supplied from the bias supply circuitry 6.

With the automatic microwave gain control device of the present embodiment, setting of the microwave output power at a predetermined magnitude is easily made, for instance, in manufacturing process by adjusting the bias voltage supplied from the bias supply circuitry.

Third Exemplary Embodiment

A structure and operation of an automatic microwave gain control device of a third embodiment of the present invention is described below by referring to FIG. 3. Circuit elements in FIG. 3 designated by the same reference numerals as FIG. 2 are not described here since they operate similarly.

Figure 2:
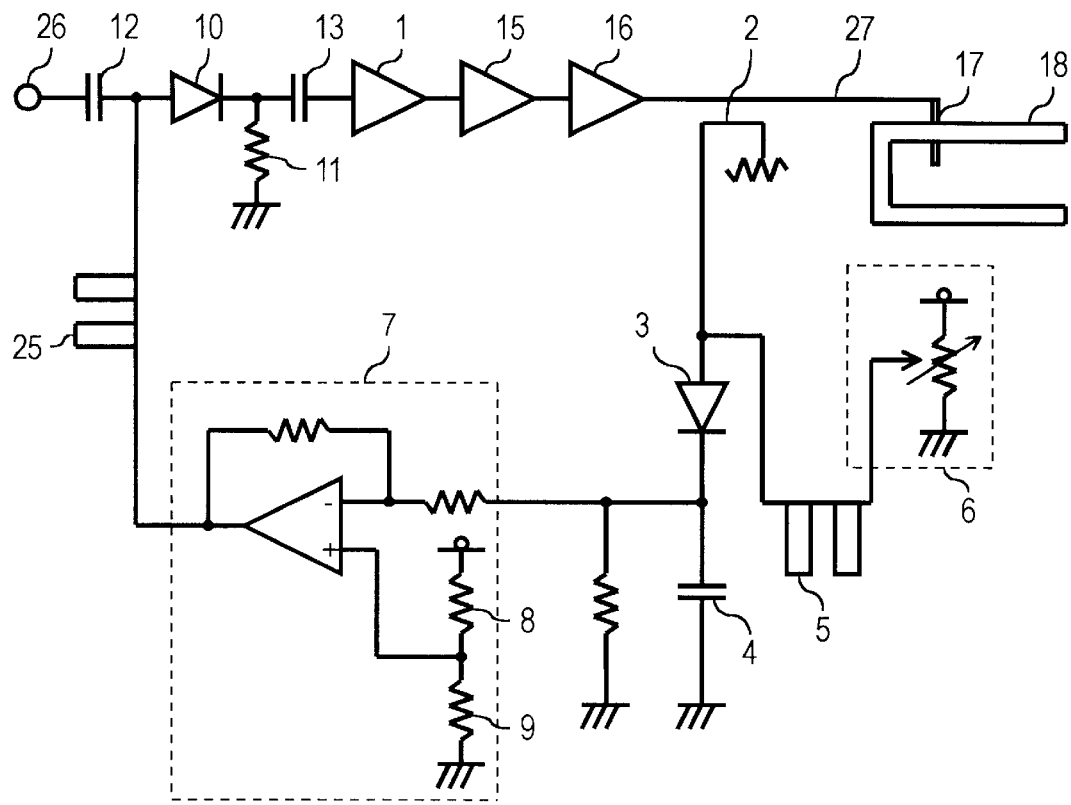
FIG. 2 is a circuit block diagram of an automatic microwave gain control device in accordance with a second exemplary embodiment of the present invention.
Figure 3:
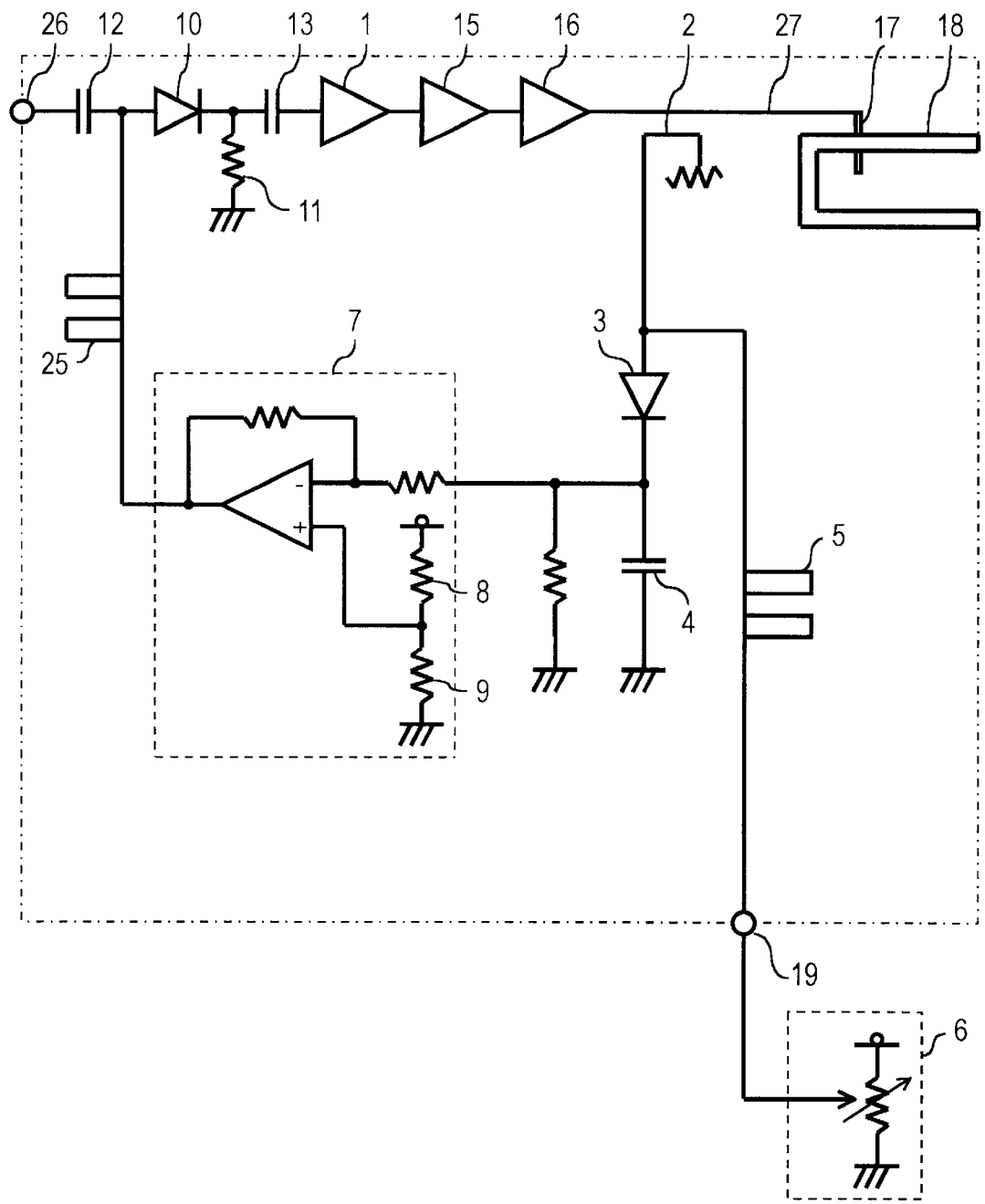
FIG. 3 is a circuit block diagram of an automatic microwave gain control device in accordance with a third exemplary embodiment of the present invention.

The automatic microwave gain control device of the third embodiment differs from that of the second embodiment in that the bias supply circuitry 6 of the present embodiment is disposed outside of the automatic microwave gain control device rather than inside, as shown in FIG. 3, whereas the same circuitry is disposed inside in case of the second embodiment as shown in FIG. 2. For this reason, the automatic microwave gain control device of this embodiment is provided with a microwave output power regulating terminal 19 for supplying a D.C. bias voltage from the externally disposed bias supply circuitry 6. In other words, the bias supply circuitry 6 is furnished within an indoor satellite communication equipment, and connected through the microwave output power regulating terminal 19. In the automatic microwave gain control device of this embodiment, therefore, the microwave output power is controlled by the bias supply circuitry 6 within the indoor satellite communication equipment.

Fourth Exemplary Embodiment

Figure 4:
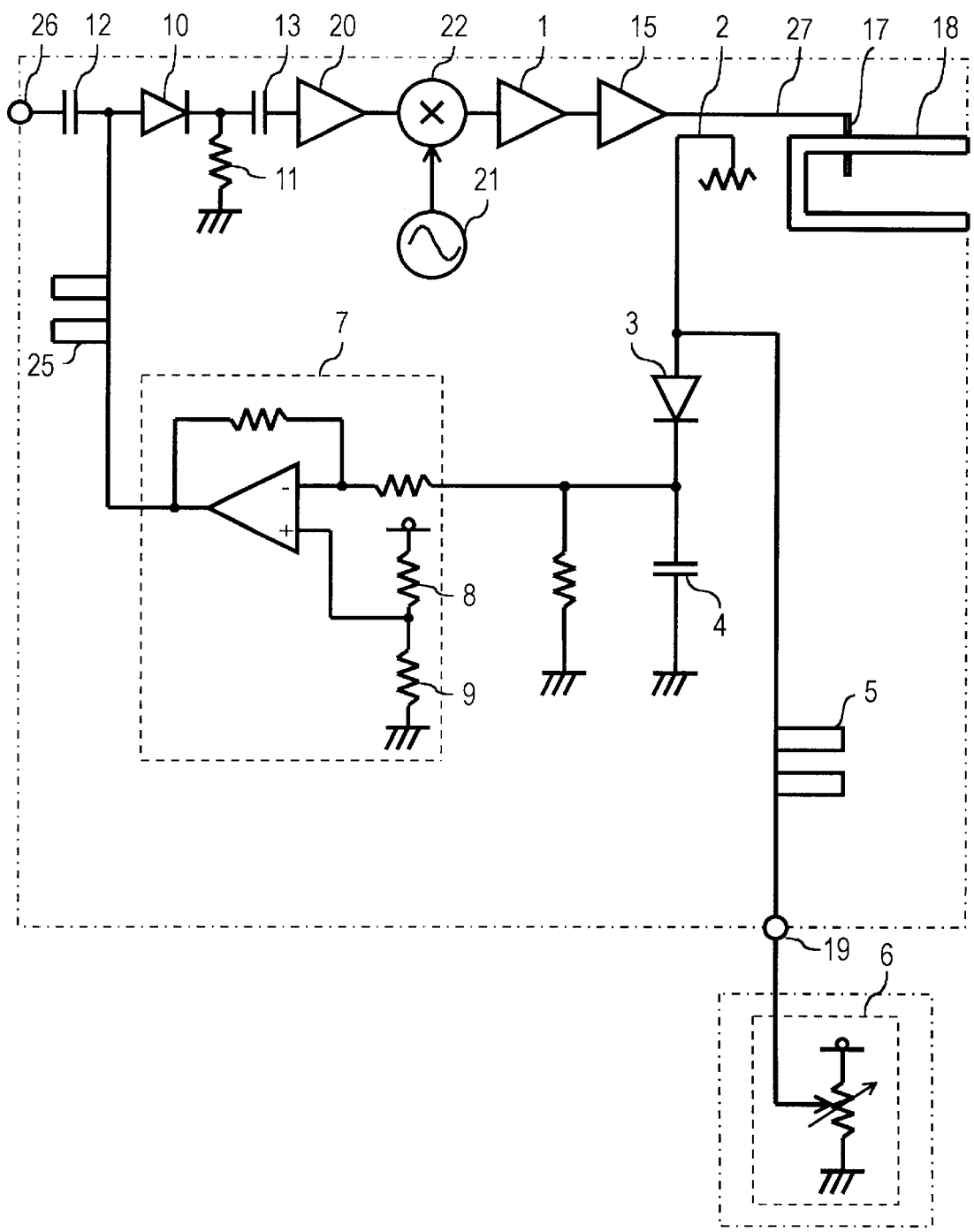
FIG. 4 is a circuit block diagram of an automatic microwave gain control device provided with a function of up-converter in accordance with a fourth exemplary embodiment of the present invention.

A structure and operation of an automatic microwave gain control device of a fourth embodiment of the present invention is described below by referring to FIG. 4. Circuit elements in FIG. 4 designated by the same reference numerals as FIG. 3 are not described here since they operate similarly.

The automatic microwave gain control device of the fourth embodiment differs from that of the third embodiment in that it is an up-converter for converting intermediate frequency signal into microwave, i.e. high frequency signal, for transmission.

An input terminal 26 is inputted with intermediate frequency signal instead of microwave. The inputted intermediate frequency signal passes through the attenuator comprising the PIN diode 10 and load resistor 11; is amplified by an intermediate frequency amplifier 20; is mixed by a frequency converter 22 with local signal inputted from a local oscillation circuitry 21; and is converted into microwave signal. The microwave signal is outputted from the waveguide 18 via the strip line 27 and the probe 17 after it is amplified by the microwave signal amplifiers 1 and 15 and by passing through the directional coupler 2.

The up-converter of the present embodiment controls the intermediate frequency signal to be inputted to the intermediate frequency amplifier 20 by operating the variable attenuator with the D.C. voltage, which is amplified by the D.C. amplifier 7 after addition of a D.C. voltage produced by detecting and smoothing of the microwave signal and the bias voltage from the externally disposed bias supply circuitry, as in the first embodiment.

The controlled intermediate frequency and the local signal inputted from the local oscillation circuitry 21 are mixed by the frequency converter 22 and converted into microwave. The microwave signal is then amplified by the microwave signal amplifiers 1 and 15, and after passing through the directional coupler 2, it is outputted from the waveguide 18 via the strip line 27 and the probe 17.

Thus, in the same manner as the first embodiment, the up-converter of the present embodiment is able to maintain the microwave output power at constant magnitude by varying the D.C. voltage of the bias supply circuitry 6 without being affected by dispersion of the characteristic and mounting position of the microwave detection diode 3.

Also, with this up-converter, the microwave output power can be controlled at a predetermined magnitude by way of controlling a bias voltage of the bias supply circuitry 6 within the indoor satellite communication equipment.

Fifth Exemplary Embodiment

Figure 5:
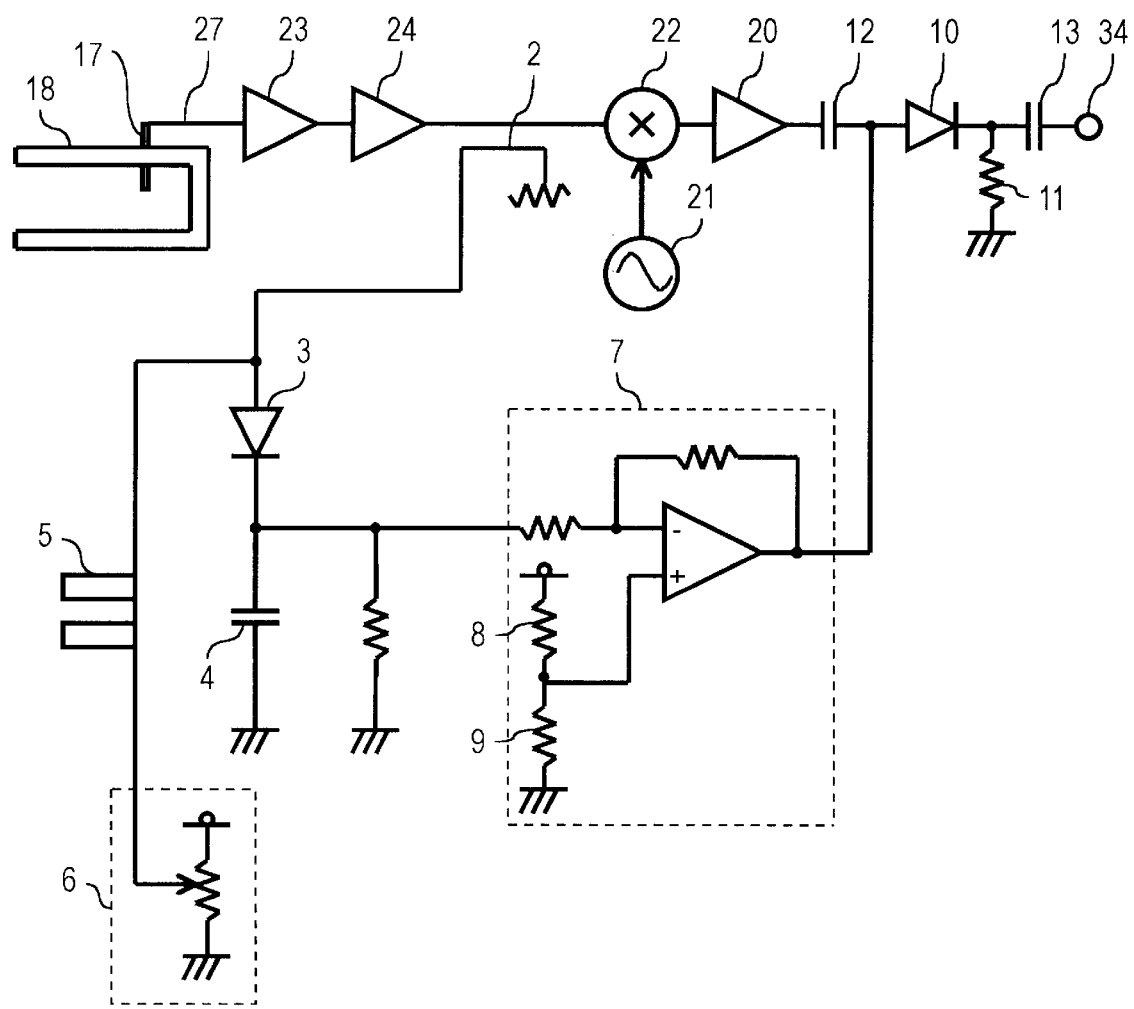
FIG. 5 is a circuit block diagram of an automatic microwave gain control device provided with a function of down-converter in accordance with a fifth exemplary embodiment of the present invention.
Figure 6:
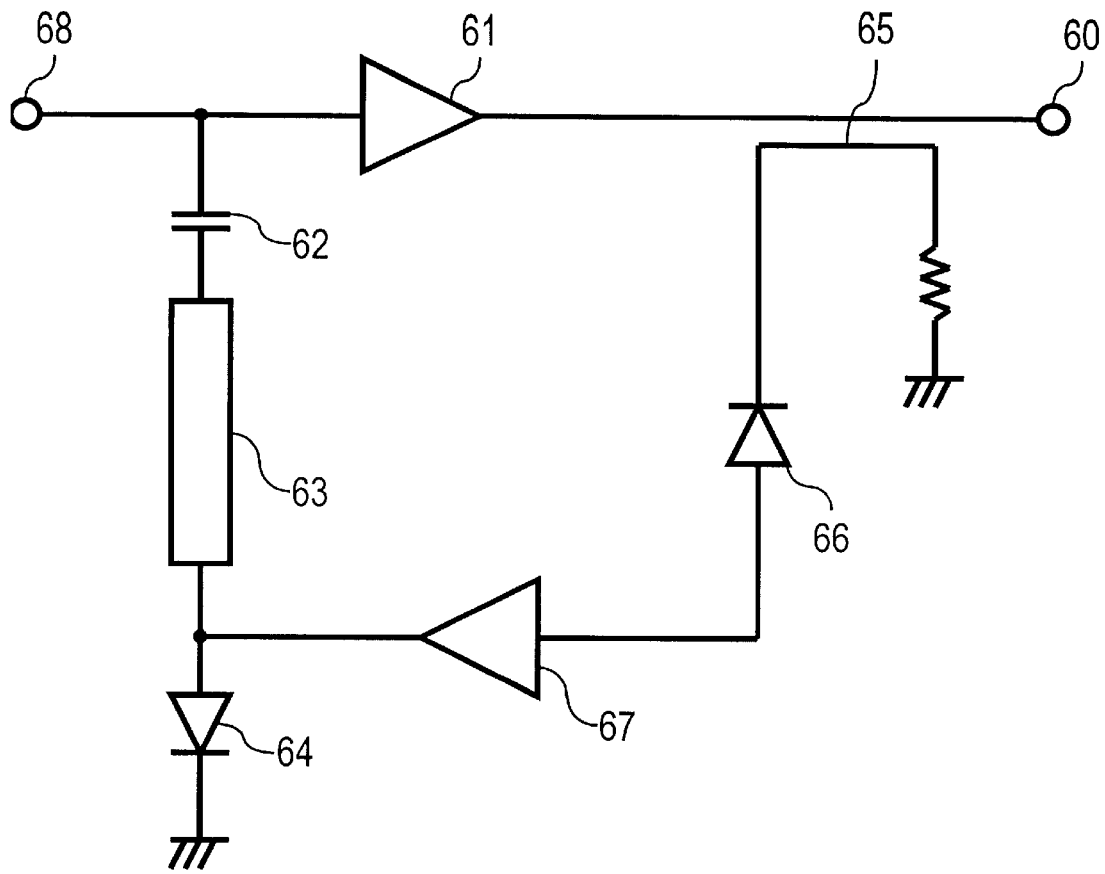
FIG. 6 is a circuit block diagram of an automatic microwave gain control device in accordance with the prior art.

A structure and operation of an automatic microwave gain control device of a fifth embodiment of the present invention is described below by referring to FIG. 5.

The automatic microwave gain control device of this embodiment is a down-converter for receiving microwave, i.e. high frequency signals, and converting the signal into intermediate frequency signal.

A probe 17 on a waveguide 18 is connected to two stages of low-noise microwave signal amplifiers 23 and 24 via a strip line 27. An output terminal of the low noise microwave signal amplifier 24 is connected to a frequency converter 22 via a directional coupler 2. The frequency converter 22 is connected with a local oscillation circuitry 21, and a produced intermediate frequency signal is outputted to an intermediate frequency amplifier 20. At an output terminal of the intermediate frequency amplifier 20, a variable attenuator comprising a PIN diode 10 and a load resistor 11 is connected via a D.C. blocker 12, and the intermediate frequency signal is outputted to an intermediate frequency signal output terminal 34 via another D.C. blocker 13. A part of the microwave signal taken out by the directional coupler 2 is outputted to the variable attenuator via a microwave detection diode 3 and a D.C. amplifier 7, which are constructed in the same way as the first embodiment.

The down-converter constructed as above operates as described below:

The microwave signal taken out by the directional coupler 2 is supplied to the microwave detection diode 3. An anode of the microwave detection diode 3 is impressed with a positive bias voltage by a D.C. bias supply circuitry 6 through a low-pass filter 5. By adjusting the D.C. bias voltage to the microwave detection diode 3, an extremely stable detection characteristic is realized since dispersion of the impedance due to dispersion of the characteristic and mounting position of the detection diode can be reduced substantially, in the same manner as the first embodiment.

The microwave signal detected by the microwave detection diode 3 is smoothed and converted into D.C. voltage by the smoothing capacitor 4, and supplied to the D.C. amplifier 7 after being added to the bias voltage, as with the case of the first embodiment. A voltage output of the D.C. amplifier 7 supplies current to the PIN diode 10. The PIN diode 10 constitutes the variable attenuator together with the load resistor 11, and magnitude of attenuation in the variable attenuator changes according to the bias current supplied to the PIN diode 10, as described in the case of the first embodiment.

That is, if the microwave power input increases, microwave power taken out from the directional coupler 2 increases; voltage supplied to the D.C. amplifier 7 increases; forward current to the PIN diode 10 decreases; magnitude of attenuation in the variable attenuator increases; so that output power of the intermediate frequency decreases. On the contrary, if the microwave power taken out from the directional coupler 2 decreases, the output power of the intermediate frequency increases due to decrease of attenuation in the variable attenuator. In this way, the down-converter of the present embodiment can stabilize the output at all the time even if the microwave power input varies.

Furthermore, when the voltage of the bias supply circuitry 6 to be supplied to the detection diode 3 is adjusted to increase, the voltage applied to the D.C. amplifier 7 increases; the forward current to the PIN diode 10 decreases; and the magnitude of attenuation in the variable attenuator increases; resulting in a decrease of the intermediate frequency power. Conversely, when the voltage of the bias supply circuitry 6 is adjusted to decrease, the voltage applied to the D.C. amplifier 7 decreases; the forward current to the PIN diode 10 increases; and the magnitude of attenuation in the variable attenuator decreases; resulting in an increase of the intermediate frequency power. Thus, the down-converter of the present embodiment is able to control magnitude of the intermediate frequency output power by adjusting the voltage of the bias supply circuitry 6.

The automatic microwave gain control device of the present embodiment can suppress interference signals effectively, when receiving microwave signal carrying a strong interference due to a radar, for example, and also control the intermediate frequency output power at constant level all the time.

In this way, the down-converter of the present embodiment controls an amplification gain of the intermediate frequency signal by operating the variable attenuator with the D.C. voltage, which is amplified by the D.C. amplifier 7 after addition of a D.C. voltage produced by detecting and smoothing of the microwave signal and the bias voltage without being affected by dispersion of the characteristic and mounting position of the microwave detection diode 3. Due to this operation, the down-converter of the present embodiment functions for maintaining the intermediate frequency output power produced at the intermediate frequency output terminal 34 being constant continually.

Also, the down-converter of the present embodiment is able to produce a desirable magnitude of the intermediate frequency output power by adjusting the D.C. voltage supplied from the bias supply circuitry 6.

Although in the described embodiments of the present invention, the variable attenuator is constructed by way of connecting the PIN diode along the signal path in series, this is not exclusive and the attenuator can be constructed in a form of "π network" and "T network" using a plurality of PIN diodes. Of course, the same effect can be attained with a structure using a field effect transistor ("FET") alternatively.

In regard to polarity of the microwave detection diode 3, the described embodiments of this invention show examples where an anode of the microwave detection diode 3 is connected with the directional coupler 2 and a positive electrode of the bias supply circuitry 6. It can be modified by connecting a cathode of the microwave detection diode 3 with the directional coupler 2 and a negative electrode of the bias supply circuitry 6, which also requires a change in polarity of the PIN diode and an alteration of the D.C. amplifier 7.

Furthermore, there exist many variations in the circuit structure of the bias supply circuitry 6 whereas the exemplary embodiments describe a way of adjusting the output voltage of the circuitry 6 by a variable resistor connected to a D.C. voltage supply. Accordingly, the present invention may be embodied in still many other ways, and the appended claims are intended to cover all modifications falling within the true spirit and scope of the invention.

What is claimed is:

1. An automatic microwave gain control device comprising:
   signal amplifier for amplifying a microwave signal;
   a directional coupler for receiving at least a portion of said amplified microwave signal;
   a bias supply circuitry supplying an adjustable D.C. bias voltage;
   microwave detection means for rectifying an addition of said D.C. bias voltage and said portion of said amplified microwave signal;
   a D.C. amplifier for amplifying said addition of said D.C. bias voltage and said portion of said amplified microwave signal after rectification;
   a variable attenuator, coupled to an output terminal of said D.C. amplifier, for varying attenuation in order to maintain an output signal of said automatic microwave gain control device substantially constant; and
   a strip line-waveguide converter coupled to said directional coupler, for converting a TEM wave into a waveguide mode.

2. An automatic microwave gain control device comprising:
   a signal amplifier for amplifying a microwave signal;
   a directional coupler for receiving at least a portion of said amplified microwave signal;
   a bias supply circuitry supplying D.C. bias voltage;
   microwave detection means for rectifying an addition of said D.C. bias voltage and said portion of said amplified microwave signal;
   a D.C. amplifier for amplifying said addition of said D.C. bias voltage and said portion of said amplified microwave signal after rectification;
   variable attenuator, coupled between an output terminal of said D.C. amplifier and an input terminal of said signal amplifier, for varying attenuation in order to maintain an output signal of said automatic microwave gain control device substantially constant; and
   a waveguide-strip line converter coupled to said directional coupler, for converting a waveguide mode into a TEM wave.

3. The automatic microwave gain control device according to claim 2, further comprising at least one low noise amplifier situated between said directional coupler and said waveguide-strip line converter.

4. The automatic microwave gain control device according to claim 1, further comprising a microwave output power regulating terminal for impressing a D.C. bias voltage from said bias supply circuitry.

5. An automatic microwave gain control device comprising:
   a signal amplifier for amplifying a microwave signal, said signal amplifier is provided with an intermediate frequency amplifier at an input side terminal thereof, a microwave signal amplifier at an output side terminal thereof, and a frequency converter;
   a directional coupler for receiving at least a portion of said amplified microwave signal;
   a bias supply circuitry supplying D.C. bias voltage;
   microwave detection means for rectifying an addition of said D.C. bias voltage and said portion of said amplified microwave signal;
   D.C. amplifier for amplifying said addition of said D.C. bias voltage and said portion of said amplified microwave signal after rectification;
   a variable attenuator, coupled to an output terminal of said D.C. amplifier, for varying attenuation in order to maintain an output signal of said automatic microwave gain control device substantially constant; and
   a strip line-waveguide converter coupled to said directional coupler, for converting a TEM wave into a waveguide mode.

* * * * *